(12) United States Patent
Bang et al.

(10) Patent No.: US 9,966,495 B2
(45) Date of Patent: May 8, 2018

(54) TRANSPARENT CONDUCTIVE LAYER AND TRANSPARENT ELECTRODE COMPRISING THE SAME

(71) Applicant: LG CHEM, LTD., Seoul (KR)

(72) Inventors: Jung-Sik Bang, Daejeon (KR); Hyeon-Woo Jang, Daejeon (KR); Jin-Hyong Lim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 172 days.

(21) Appl. No.: 14/480,392

(22) Filed: Sep. 8, 2014

(65) Prior Publication Data

US 2014/0374242 A1    Dec. 25, 2014

Related U.S. Application Data

(62) Division of application No. 13/121,577, filed as application No. PCT/KR2009/005482 on Sep. 25, 2009, now abandoned.

(30) Foreign Application Priority Data

Sep. 30, 2008  (KR) .................. 10-2008-0095920
Sep. 25, 2009  (KR) .................. 10-2009-0090854

(51) Int. Cl.
*H01L 31/18*     (2006.01)
*C23C 14/34*     (2006.01)
(Continued)

(52) U.S. Cl.
CPC .......... *H01L 31/1884* (2013.01); *C23C 14/34* (2013.01); *H01L 31/02366* (2013.01);
(Continued)

(58) Field of Classification Search
CPC .......... H01L 31/1884; H01L 31/02366; H01L 31/188; C23C 14/344
See application file for complete search history.

(56) References Cited

U.S. PATENT DOCUMENTS 5,453,135 A    9/1995  Nakagawa et al.
5,458,753 A    10/1995  Sato et al.
(Continued)

FOREIGN PATENT DOCUMENTS

JP    05-075153    3/1993
JP    05-275727    10/1993
(Continued)

OTHER PUBLICATIONS

Chung, et al., Applied Surface Science, 2008, vol. 255, pp. 2494-2499.*

(Continued)

*Primary Examiner* — Sadie White
(74) *Attorney, Agent, or Firm* — Dentons US LLP (57) ABSTRACT

Disclosed are a transparent conductive layer and a transparent electrode comprising the same, and in particular, a zinc oxide-based transparent conductive layer having a textured surface, wherein the textured surface has protrusions, each protrusion having a ridge forming an arc in its protruding direction, or having an apex at an edge thereof such that two ridges forms an obtuse angle of 90° or more. The transparent conductive layer is manufactured by sputtering only without wet etching.

3 Claims, 6 Drawing Sheets

(51) Int. Cl.
*H01L 31/0224* (2006.01)
*H01L 31/0236* (2006.01)
*H01L 21/02* (2006.01)

(52) U.S. Cl.
CPC ............... *H01L 31/022466* (2013.01); *H01L 31/022483* (2013.01); *H01L 21/02554* (2013.01); *Y02E 10/50* (2013.01); *Y10T 428/24355* (2015.01)

(56) References Cited

U.S. PATENT DOCUMENTS

| | | | |
|---|---|---|---|
| 6,576,112 | B2 | 6/2003 | Sonoda et al. |
| 7,179,527 | B2 * | 2/2007 | Sato .................. C23C 16/0272 |
| | | | 136/255 |
| 2001/0012569 | A1 | 8/2001 | Arao et al. |
| 2002/0063065 | A1 | 5/2002 | Sonoda et al. |
| 2004/0234823 | A1 | 11/2004 | Burgener, II et al. |
| 2005/0000564 | A1 | 1/2005 | Sato et al. |
| 2005/0166960 | A1 | 8/2005 | Jin et al. |
| 2008/0050595 | A1 * | 2/2008 | Nakagawara ......... C23C 14/086 |
| | | | 428/412 |
| 2008/0283802 | A1 * | 11/2008 | Abduev ................ C04B 35/453 |
| | | | 252/519.51 |
| 2009/0223556 | A1 * | 9/2009 | Niesen ................ H01L 31/0322 |
| | | | 136/255 |
| 2010/0024862 | A1 | 2/2010 | Tawanda |

FOREIGN PATENT DOCUMENTS

| | | |
|---|---|---|
| JP | 06-025838 | 2/1994 |
| JP | 11-233800 | 8/1999 |
| JP | 2000-022189 A | 1/2000 |
| JP | 2002-114598 | 4/2002 |
| JP | 2003-105533 A | 4/2003 |
| JP | 2003-115599 | 4/2003 |
| JP | 2004-296597 A | 10/2004 |
| JP | 2006-134789 A | 5/2006 |
| JP | 2007-113109 | 5/2007 |
| JP | 2007-154255 | 6/2007 |
| JP | 2007-288043 | 11/2007 |
| JP | 2008-110911 | 5/2008 |
| KR | 10-0176291 | 11/1998 |
| KR | 10-2001-0093732 | 10/2001 |
| KR | 10-2003-0078009 | 10/2003 |
| KR | 10-2005-0079092 | 8/2005 |
| KR | 10-2006-0132351 | 12/2006 |
| WO | 1992-0189990 A1 | 4/1991 |
| WO | 2008-062685 A1 | 11/2007 |
| WO | 2008/105614 A1 | 9/2008 |
| WO | WO 2008105614 A1 * | 9/2008 ......... C03C 17/3417 |

OTHER PUBLICATIONS

Chen, et al., Applied Physics Letters, 2004, vol. 85, pp. 5628-5630.*
Nakada, et al., Japanese Journal of Applied Physics, 1991, vol. 30, pp. 3344-3348.*
Nakada et al. "Effect of water vapor on the growth of textured ZnO-Based Films for solar cells by DC-Magnetron sputtering", Japanese Journal of Applied Physics, vol. 30, No. 12A, Dec. 1991, pp. 3344-3348.
Suzuki et al. "Crystal Growth of ZnO:Al Thing films prepared by RF magnetron sputtering—pressure dependency", vacuum, 38 (1995), p. 832.
Minami et al. "Large area milky transparent conducting Al-doped ZnO films prepared by magnetron sputtering", Jpn. J. Appl. Phys. vol. 31, pp. L1106-L1109, Aug. 1992.
U.S. Appl. No. 13/121,577, filed Mar. 29, 2011.

* cited by examiner

TRANSPARENT CONDUCTIVE LAYER AND TRANSPARENT ELECTRODE COMPRISING THE SAME

This application is a Divisional of U.S. patent application Ser. No. 13/121,577, filed Mar. 29, 2011, which is a National Stage entry of International Application No. PCT/KR2009/005482 filed on Sep. 25, 2009, and claims priority of U.S. Korean Application Nos. 10-2008-0095920 filed Sep. 30, 2008 and 10-2009-0090854 filed Sep. 25, 2009, all of which are incorporated by reference in their entirety herein.

BACKGROUND OF THE INVENTION

Field of the Invention

The present invention relates to a zinc oxide-based transparent conductive layer having a textured surface, its manufacturing method and a transparent electrode for a solar cell using the same.

Description of the Related Art

In the case of a thin-film silicon-based solar cell, because a silicon has a small extinction coefficient, it needs to increase the efficiency of the solar cell by increasing the path of an incident light by light scattering in an absorption layer. For this purpose, the surface of a front electrode of a thin-film solar cell is textured to increase the optical conversion efficiency. Currently, the front electrode of the thin-film solar cell largely is classified into two types of transparent conductive layers; FTO (F doped $SnO_2$ (fluorine-doped tin oxide)) and ZnO (zinc oxide).

A FTO transparent conductive layer is manufactured by atmospheric pressure CVD (Chemical Vapor Deposition) using HF and $SnCl_4$ as reaction gases, and should have a relatively large thickness (normally ~1 μm or more). Here, the deposition process is generally performed at a high temperature of 600° C. or above. The FTO transparent conductive layer is very weak against a hydrogen atmosphere, that is, the FTO transparent conductive layer has low transmittance due to a reduction reaction of hydrogen plasma that generates during PECVD (Plasma Enhanced Chemical Vapor Deposition) used to form an active layer (for example, amorphous Si) of a thin-film silicon solar cell.

On the other hand, the zinc oxide-based transparent conductive layer has excellent resistance against a reduction reaction of hydrogen plasma, and thus, its research is in active progress for the purpose of substituting for the FTO transparent conductive layer in a thin-film silicon solar cell. In the manufacture of the zinc oxide-based transparent conductive layer, atmospheric pressure CVD has problems with stability of an organic precursor and so on and does not yet have the established optimum conditions therefor, and sputtering has difficulty in surface texturing.

Accordingly, a two-step manufacturing method has been developed to manufacture a zinc oxide-based transparent conductive layer having a textured surface, which comprises depositing a thick zinc oxide-based transparent conductive layer with a sputter, and texturing the surface of the conductive layer through wet etching. However, this method needs wet etching after deposition of a thick layer, resulting in complicated process and increased time.

SUMMARY OF THE INVENTION

The present invention is designed to solve the problems of the prior art, and therefore it is an object of the present invention to provide a method for manufacturing a zinc oxide-based transparent conductive layer that is used as a transparent electrode and has a textured surface for improved optical conversion efficiency, and at this time, surface texturing is accomplished by controlling various process parameters during sputter deposition, thereby eliminating the need for wet etching.

And, it is an object of the present invention to provide a zinc oxide-based transparent conductive layer having a different surface texture structure from conventional structures through the above-mentioned manufacturing method.

Further, it is an object of the present invention to provide a transparent electrode comprising said transparent conductive layer and a solar cell comprising said transparent electrode.

To achieve the objects, the present invention provides a zinc oxide-based transparent conductive layer having a textured surface, wherein the textured surface has protrusions, each protrusion having a ridge forming an arc in its protruding direction, or having an apex at an edge thereof such that two ridges forms an obtuse angle of 90° or more.

Preferably, an X-ray diffraction image of the conductive layer having the textured surface has only a (002) peak.

And, in an embodiment of the present invention, the protrusion of the textured surface may have a diagonal length of 200 to 600 nm in a base thereof and a height of 30 to 250 nm, however the present invention is not limited in this regard.

And, in an embodiment of the present invention, the conductive layer may have, as a dopant, at least one element selected from the group consisting of group 13 elements in the periodic table and transition metals having an oxidation number of +3. Specifically, the conductive layer has, as a dopant, at least one element selected from the group consisting of aluminum, gallium, boron and silicon. In this case, a dopant content in the conductive layer may be 4 wt % or less, preferably 3 wt % or less. For example, in the case that gallium is solely used as a dopant, a gallium content in the conductive layer may be less than 3 wt %. In the case that aluminum is solely used as a dopant, an aluminum content in the conductive layer may be 1 wt % or less. In the case that boron is solely used as a dopant, a boron content in the conductive layer may be 1 wt % or less. In the case that gallium and aluminum are used as a dopant, an aluminum content in the conductive layer may be 0.5 wt % or less and a gallium content may be 1.0 wt % or less.

And, to achieve the objects, the present invention provides a method for manufacturing a zinc oxide-based transparent conductive layer, comprising sputtering from a zinc oxide target having a dopant content of 0 to 4 wt % in the presence of a mixed gas of argon and hydrogen under conditions of pressure of 1 to 30 mTorr and temperature of 100 to 500° C.

Preferably, the content of the hydrogen gas may be 1 to 30 vol % relative to the entire gas, however the present invention is not limited in this regard.

And, $H_2O$ may be further introduced during the sputtering process.

The zinc oxide-based transparent conductive layer according to the present invention is formed on a transparent substrate and can be used as a transparent electrode, and the transparent electrode according to the present invention is very useful as a front electrode of a solar cell.

Effects of the Invention

The manufacturing method of the present invention can manufacture a zinc oxide-based transparent conductive layer having a textured surface only by sputtering and eliminates the need for a separate process such as wet etching and so on, and as a result, a process is simplified, manufacturing time is reduced, surface texturing is accomplished uniformly in size and shape over the entire thin layer, and it is possible to manufacture a transparent conductive layer of small thickness and low specific resistance.

The zinc oxide-based transparent conductive layer of the present invention can be used as an electrode of various devices such as thin-film solar cells and so on.

BRIEF DESCRIPTION OF THE DRAWINGS

Other objects and aspects of the present invention will become apparent from the following description of embodiments with reference to the accompanying drawing in which.

DESCRIPTION OF THE PREFERRED EMBODIMENT

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

Figure 1:
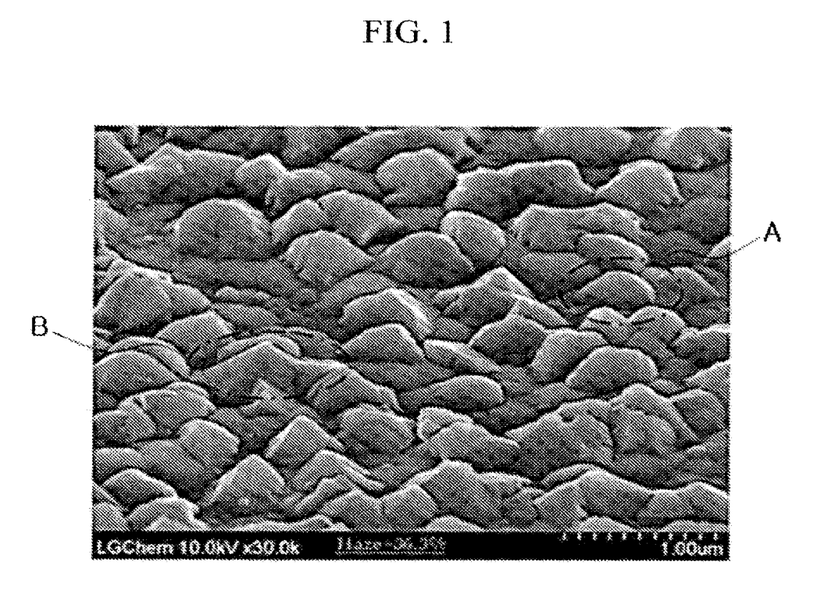
FIG. 1 is an SEM (Scanning Electron Microscopy) image of the surface of a zinc oxide-based transparent conductive layer manufactured according to example 1.

FIG. 1 shows an SEM image of a zinc oxide-based transparent conductive layer having a textured surface according to an embodiment of the present invention. However, the description proposed herein is just a preferable example for the purpose of illustrations only, not intended to limit the scope of the invention, so it should be understood that other equivalents and modifications could be made thereto without departing from the spirit and scope of the invention.

Referring to FIG. 1, the transparent conductive layer of the present invention has a textured surface where protrusions of a relatively gentle slope are formed. A close inspection reveals that a majority of the protrusions according to the present invention substantially have two types of shapes (shown in sections A and B of FIG. 1).

Figure 2:
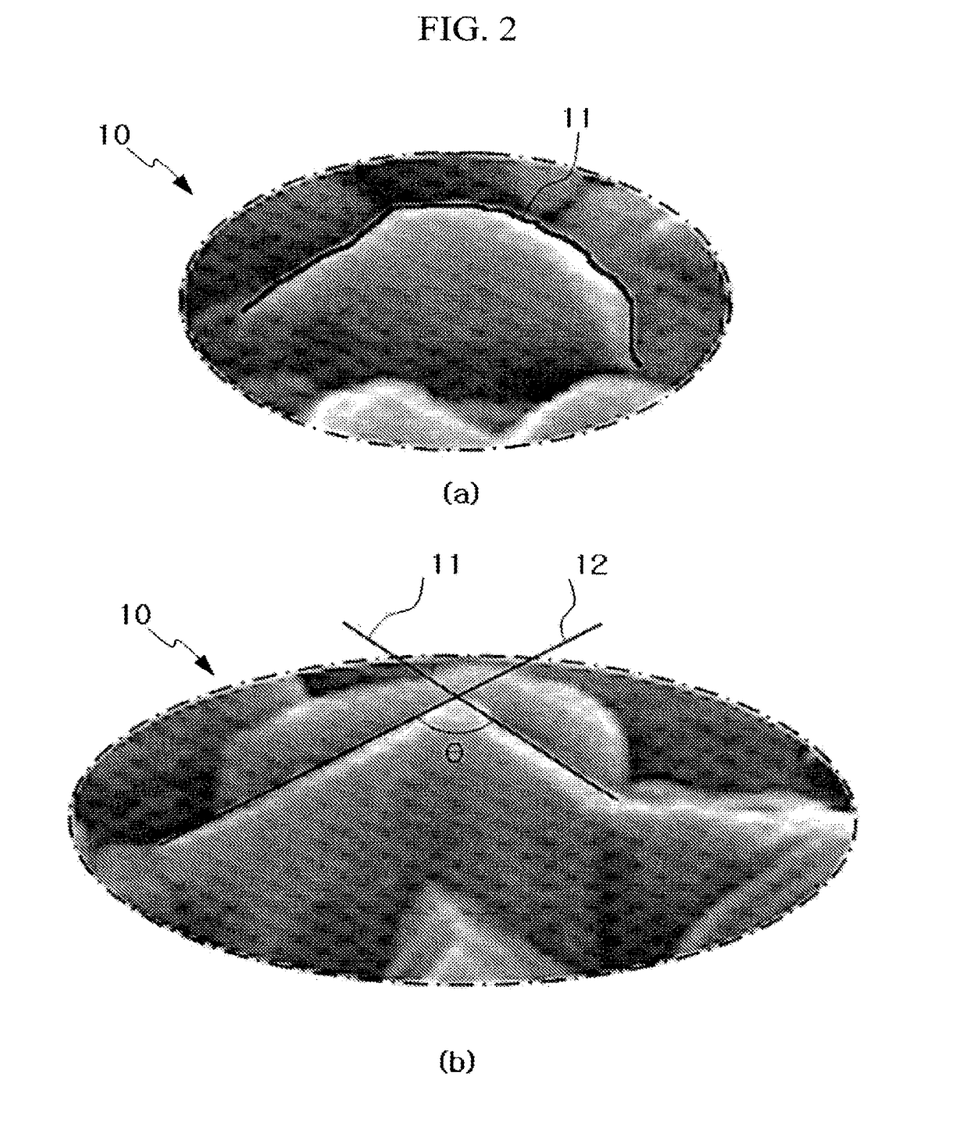
FIG. 2 is an enlarged SEM image of the surface of the zinc oxide-based transparent conductive layer manufactured according to example 1.

A first type protrusion 10 is illustrated in section A of FIG. 1 and its enlarged view is shown in FIG. 2(a). The first type protrusion 10 has a ridge 11 formed by junction of surfaces. The ridge 11 forms an arc in a protruding direction of the protrusion 10. In this case, in the present invention, the "arc" includes a substantially curved line, not a straight line, as well as a perfect arc as a portion of a circle.

A second type protrusion 10 is illustrated in section B of FIG. 1 and its enlarged view is shown in FIG. 2(b). The second type protrusion 10 has a shape of a cone having an apex formed by junction of at least two ridges. An angle ($\theta$) of two ridges 11 and 12 is an obtuse angle of 90° or more. In the present invention, the "obtuse angle" is an angle between 90° and 180°.

The "majority of the protrusions" means 40% or more, preferably 50% or more, more preferably 70% or more, of the total number of protrusions. In this case, in the present invention, because protrusions having two types of shapes are found in great numbers, there is no special maximum limit in the number of protrusions. For example, 90% of protrusions, preferably 99% may have the two types of shapes, however the present invention is not limited in this regard.

The size of the protrusion according to the present invention may vary depending on specific sputtering conditions in the manufacturing process. For example, the protrusion may have a diagonal length of 200 to 600 nm in the base thereof, and a height of 30 to 250 nm. The above-mentioned ranges lead to excellent light scattering effects. And, the protrusion may have $R_a$ (surface roughness) of 15 nm or more.

Figure 6:
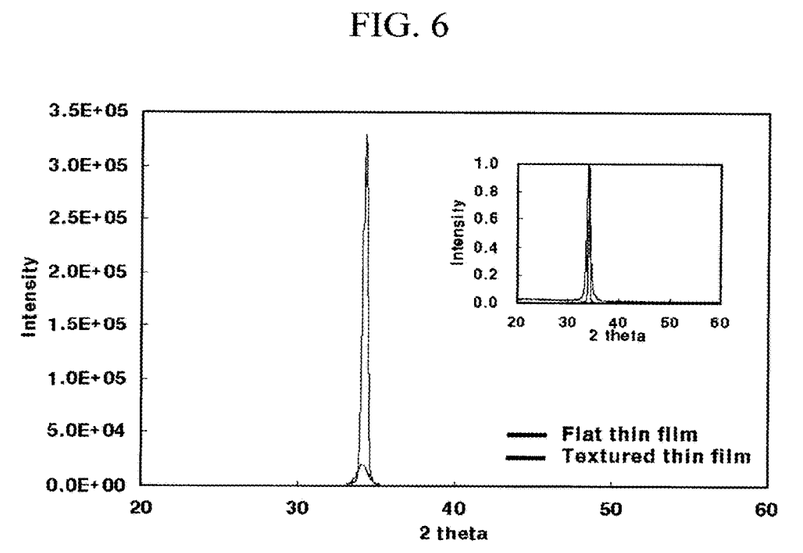
FIG. 6 is an XRD (X-Ray Diffraction) graph of the surface of the zinc oxide-based transparent conductive layer manufactured according to example 1.

FIG. 6 shows an X-ray diffraction image of a conductive layer having a textured surface according to an embodiment of the present invention. Referring to FIG. 6, the X-ray diffraction image has only a (002) peak. Accordingly, surface texture of the conductive layer according to the present invention has a predetermined directivity.

To improve conductivity, the zinc oxide-based transparent conductive layer of the present invention may further include, as a dopant, at least one element selected from the group consisting of group 13 elements in the periodic table and transition metals having an oxidation number of +3. Preferably, the zinc oxide-based transparent conductive layer may further include, as a dopant, at least one selected from the group consisting of aluminum, gallium, boron and silicon, however the present invention is not limited in this regard.

The dopant content in the conductive layer of the present invention may be 4 wt % or less, preferably 3 wt % or less. If the dopant content exceeds 4 wt %, surface texturing may not be accomplished and the specific resistance of the conductive layer may increase. The minimum limit of the dopant content is not limited to a specific value if it can improve conductivity, however a preferable minimum limit may be 0.1 wt % to expect the effect of addition of a dopant.

Specifically, if gallium is solely used as a dopant, the content of gallium in the conductive layer may be less than 3 wt %. If aluminum is solely used as a dopant, the content of aluminum in the conductive layer may be 1 wt % or less. If boron is solely used as a dopant, the content of boron in the conductive layer may be 1 wt % or less. If gallium and aluminum are used as a dopant, the content of aluminum in the conductive layer may be 0.5 wt % or less and the content of gallium may be 1.0 wt % or less. In the conductive layer of the present invention, there is a critical significance that if a specific dopant content exceeds the above-mentioned maximum limit, surface texturing is not accomplished.

The conductive layer of the present invention may have preferably a thickness of 100 to 500 nm. However, the thickness may be controlled according to definite purpose of use, and accordingly, the present invention is not limited to a specific thickness. If the thickness of the conductive layer is less than 100 nm, it results in reduction in electrical conductivity and size of protrusions of surface texture. If the thickness of the conductive layer exceeds 500 nm, transmittance of the conductive layer may diminish.

The conductive layer of the present invention may have various haze values depending on surface texturing under various conditions. For example, the conductive layer of the present invention may have a haze value of 5% or more.

Preferably, the conductive layer of the present invention has a suitable level of conductivity to be used as an electrode. For example, the conductive layer has preferably a specific resistance of $5\times10^{-2}$ Ωcm.

Hereinafter, a method for manufacturing a zinc oxide-based transparent conductive layer according to an embodiment of the present invention is described in detail.

The method for manufacturing a zinc oxide-based transparent conductive layer according to the present invention comprises sputtering from a zinc oxide target having 0 to 4 wt % of a dopant in the presence of a mixed gas of argon and hydrogen under conditions of pressure of 1 to 30 mTorr and temperature of 100 to 500° C.

The method for manufacturing a transparent conductive layer according to the present invention does not use FTO (F doped SnO2) weak against a hydrogen atmosphere, but zinc oxide. And, a conventional method for manufacturing a zinc oxide-based transparent conductive layer requires wet etching after deposition, while the manufacturing method of the present invention can manufacture a zinc oxide-based transparent conductive layer having a textured surface without wet etching by controlling various sputtering conditions.

In the present invention, the zinc oxide sputtering target may further contain a dopant, and the dopant content is mentioned above.

In the sputtering process of the present invention, a mixed gas of argon (Ar) and hydrogen ($H_2$) is used as an atmosphere gas. Preferably, the content of the hydrogen gas is 1 to 30 vol % relative to the entire gas. If the content of the hydrogen gas is less than 1 vol %, surface texturing is not properly accomplished. If the content of the hydrogen gas exceeds 30 vol %, light transmittance of a thin layer may diminish.

Optionally, $H_2O$ may be further introduced during the sputtering process of the present invention. $H_2O$ may be introduced into a chamber through a separate injection device (for example, a leak valve), and its content is preferably 20 vol % or less relative to the entire gas.

In the sputtering process of the present invention, the pressure is preferably 1 to 30 mTorr. If the pressure is less than 1 mTorr, a plasma is not stably generated, and consequently it is difficult to deposit a layer. If the pressure exceeds 30 mTorr, the size of protrusions of surface texture remarkably decreases.

In the sputtering process of the present invention, the temperature is preferably 100 to 500° C., preferably 100 to 400° C., more preferably about 200° C. or so. If the temperature is less than 100° C., the size of protrusions of surface texture decreases.

The present invention is not limited to a specific sputtering technique if it is typically used in the art. For example, RF (radio-frequency) or DC (direct-current) sputtering may be used.

The zinc oxide-based transparent conductive layer manufactured by sputtering according to the present invention is deposited on a suitable substrate, and at this time, if the substrate is a transparent substrate, a transparent electrode is manufactured. If it is a transparent substrate on which the zinc oxide-based transparent conductive layer of the present invention is deposited to manufacture a transparent electrode, the present invention is not limited to a specific type substrate. For example, the substrate may be glass substrate, plastic substrate, oxide deposited substrate and so on.

The transparent electrode of the present invention can be used as a front electrode of a thin-film solar cell.

Hereinafter, the present invention will be described in detail through specific examples. However, the description proposed herein is just a preferable example for the purpose of illustrations only, not intended to limit the scope of the invention, so it should be understood that the examples are provided for a more definite explanation to an ordinary person skilled in the art.

Example 1: Manufacture of Ga Doped ZnO/Glass with (Ar+$H_2$) Transparent Conductive Layer A zinc oxide-based transparent conductive layer was deposited on a glass substrate at a thickness shown in Table 1 using a zinc oxide target doped with 2.72 wt % of Ga by means of an RF magnetron sputter under temperature of about 200° C. and pressure of about 3 mTorr. At this time, a working gas was a mixed gas of Ar and $H_2$ at a mixing ratio of 7 vol % of $H_2$/(Ar+$H_2$).

Comparative Example 1: Manufacture of Ga Doped ZnO/Glass with Ar Transparent Conductive Layer A zinc oxide-based transparent conductive layer was manufactured in the same way as example 1 except that Ar gas was solely used as a working gas.

Comparative Example 2: Manufacture of Ga Doped ZnO/Glass with (Ar+$H_2$) Transparent Conductive Layer A zinc oxide-based transparent conductive layer was manufactured in the same way as example 1 except that a doping content of Ga was 5.5 wt %.

Comparative Example 3: Manufacture of Ga Doped ZnO/Glass with (Ar+$H_2$) Transparent Conductive Layer A zinc oxide-based transparent conductive layer was manufactured in the same way as example 1 except that a deposition temperature of a thin layer was RT(~23° C.).

Experimental Example 1: Measurement of Haze of a Transparent Conductive Layer and Observation on Surface Texture The haze of each zinc oxide-based transparent conductive layer of example 1 and comparative examples 1 to 3 was measured, and the results are shown in Table 1. An SEM image of the surface of each conductive layer is provided in FIG. 1 (example 1) and FIGS. 3 to 5 (comparative examples 1 to 3, respectively).

TABLE 1

| Specimen type | Atmosphere gas | Deposition temperature (° C.) | Thickness (nm) | Haze (%) |
| --- | --- | --- | --- | --- |
| Example 1 | GZO(2.72 wt %)/Glass | Ar + $H_2$ | 200 | ~450 | 36.30 |
| Comparative example 1 | GZO(2.72 wt %)/Glass | Ar | 200 | ~550 | 0.16 |
| Comparative example 2 | GZO(5.5 wt %)/Glass | Ar + $H_2$ | 200 | ~440 | 0.13 |
| Comparative example 3 | GZO(2.5 wt %)/Glass | Ar + $H_2$ | RT | ~400 | 0.21 |

FIG. 1 is an SEM image of the surface of a transparent conductive layer manufactured according to example 1. As shown in FIG. 1, surface texturing was effectively accomplished. Light scattering occurred on the textured surface, and as a result, a haze value was very large (36.3%).

Figure 3:
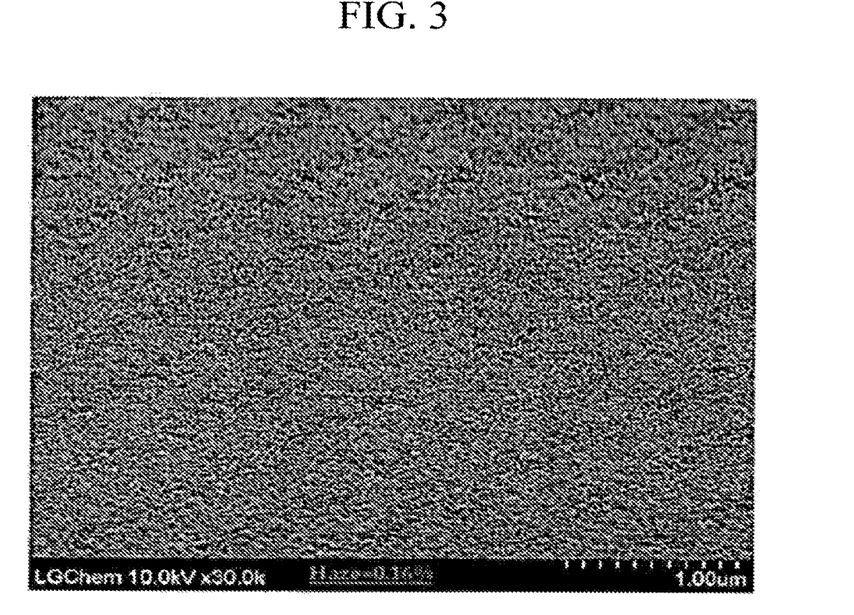
FIG. 3 is an SEM image of the surface of a zinc oxide-based transparent conductive layer manufactured according to comparative example 1.

FIG. 3 is an SEM image of the surface of a transparent conductive layer manufactured according to comparative example 1. Dissimilarly from FIG. 1, large surface texture was not observed, and as a result, a haze value was very small (0.16%). The specimen of comparative example 1 was manufactured using solely Ar as a working gas, without mixing with hydrogen gas whereby surface texture was not observed. It is found from the observation that mixing with hydrogen gas is a critical factor to surface texturing.

Figure 4:
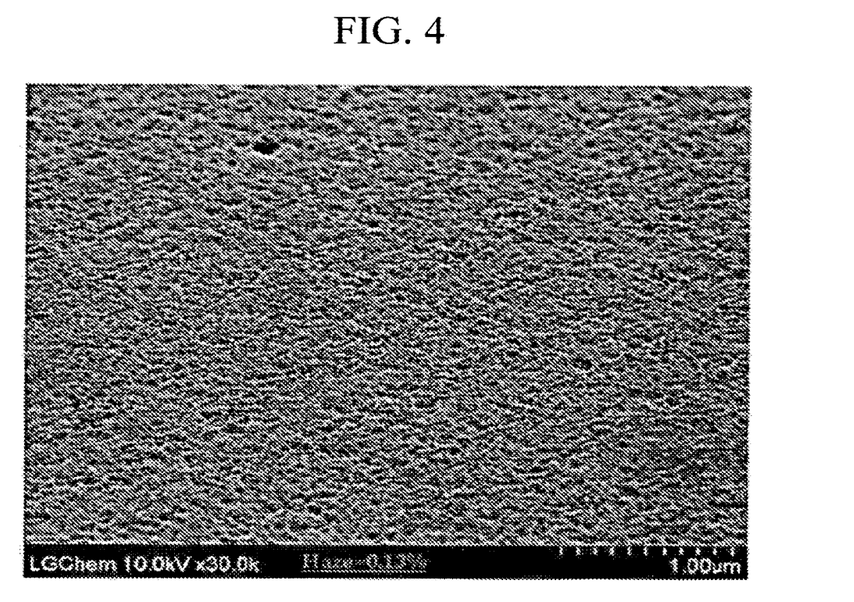
FIG. 4 is an SEM image of the surface of a zinc oxide-based transparent conductive layer manufactured according to comparative example 2.

FIG. 4 is an SEM image of the surface of a transparent conductive layer manufactured according to comparative example 2. Dissimilarly from FIG. 1, large surface texture was not observed, and as a result, a haze value was very small (0.13%). The specimen of comparative example 2 was manufactured with a dopant content outside the range of the present invention whereby surface texture was not observed. It is found from the observation that there is a suitable dopant content for surface texturing according to the present invention, and its detailed description is in the following experimental example 2.

Figure 5:
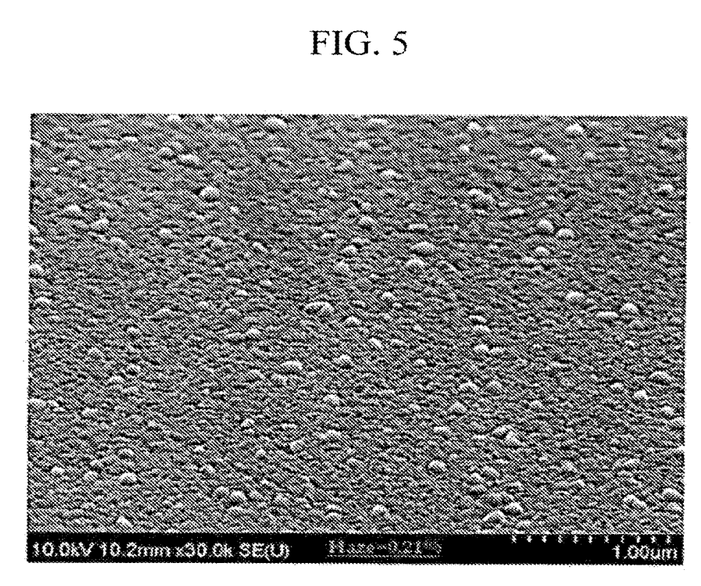
FIG. 5 is an SEM image of the surface of a zinc oxide-based transparent conductive layer manufactured according to comparative example 3.

FIG. 5 is an SEM image of the surface of a transparent conductive layer manufactured according to comparative example 3. Dissimilarly from example 1, surface texturing was not sufficiently accomplished. It is found from the observation that the shape of surface texture relies on deposition temperature. That is, for proper surface texturing, a specimen should be manufactured within the temperature range of the present invention.

Experimental Example 2: Surface Texturing Depending on Dopant Content (1) Gallium (Ga)

The sputter deposition was performed in the same way as example 1 except that Ga content was used as shown in the following Table 2.

After observing the shape of surface texture of a conductive layer deposited with a change in dopant content, 5% or more of haze was evaluated as "O" and the rest as "X".

TABLE 2

| | Ga content (wt %) | | | | | | | |
| --- | --- | --- | --- | --- | --- | --- | --- | --- |
| | 0.0 | 0.5 | 1.8 | 2.5 | 2.7 | 3.0 | 4.5 | 5.5 |
| Texturing | O | O | O | O | O | X | X | X |

As shown in Table 2, in the case that Ga is used as a dopant, less than 3 wt % of Ga leads to proper surface texture.

(2) Aluminum (Al)

The sputter deposition was performed in the same way as example 1 except that Al content was used as shown in the following Table 3.

The evaluation standard of surface texture is as mentioned above.

TABLE 3

| | Al content(wt %) | | | |
| --- | --- | --- | --- | --- |
| | 1.00 | 1.25 | 1.50 | 2.00 |
| Texturing | O | X | X | X |

As shown in Table 3, in the case that Al is used a dopant, 1 wt % or less of Al leads to proper surface texture.

(3) Aluminum and Gallium (Al, Ga)

The sputter deposition was performed in the same way as example 1 except that Al and Ga contents were used as shown in the following Table 4.

The evaluation standard of surface texture is as mentioned above.

TABLE 4

| Al content(wt %) | 0.50 | 0.80 | 0.50 | 0.80 | 1.00 |
| --- | --- | --- | --- | --- | --- |
| Ga content(wt %) | 0.75 | 0.50 | 1.00 | 1.00 | 1.50 |
| Texturing | O | O | O | X | X |

As shown in Table 4, in the case that Al and Ga are used as a dopant, 0.5 wt % or less of Al and 1.0 wt % of Ga leads to proper surface texture.

Experimental Example 3: X-Ray Diffraction Measurement

X-ray diffraction (XRD) analysis was made on the transparent conductive layer having a textured surface according to example 1, and the results are shown in FIG. 6.

As shown in FIG. 6, a zinc oxide-based transparent conductive layer having a textured surface according to the present invention has only a (002) peak.

Example 2: Manufacture of (Ga+B) Doped ZnO/Glass with (Ar+$H_2$+$H_2O$) Transparent Conductive Layer A zinc oxide-based transparent conductive layer was deposited on a glass substrate using a zinc oxide target doped with 2.5 wt % of Ga and 0.2 wt % of B by means of an RF magnetron sputter under temperature of about 200° C. and pressure of about 3 mTorr.

The working gas was a mixed gas of Ar and $H_2$ at a mixing ratio of 7 vol % of $H_2/(Ar+H_2)$. And, $H_2O$ was introduced into a chamber through a leak valve capable of injecting water into a gas line. The thickness of the thin layer was controlled to 150 to 200 nm.

Comparative Example 4: Manufacture of Ga Doped
ZnO/Glass with (Ar+H₂O) Transparent Conductive
Layer A zinc oxide-based transparent conductive layer was manufactured in the same way as example 2 except that B was not used as a dopant and H₂ gas was not used.

Experimental Example 4: Analysis of Shape of
Surface Texture and Roughness

Figure 7:
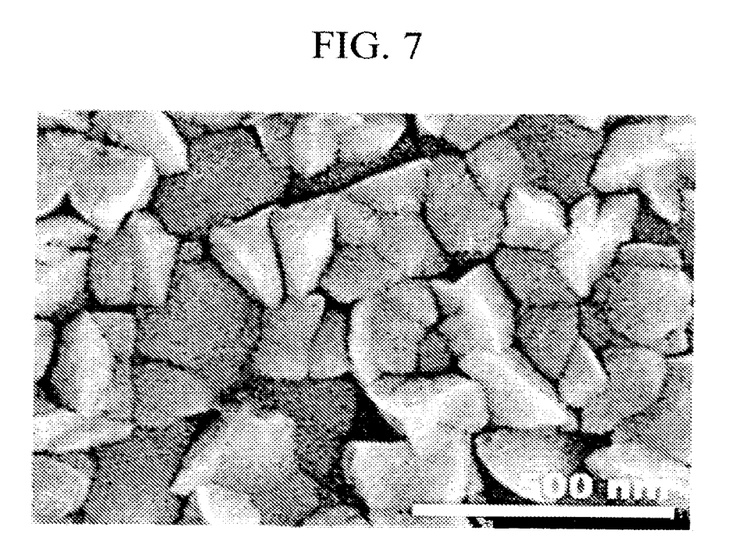
FIG. 7 is an SEM image of the surface of a zinc oxide-based transparent conductive layer manufactured according to example 2.
Figure 8:
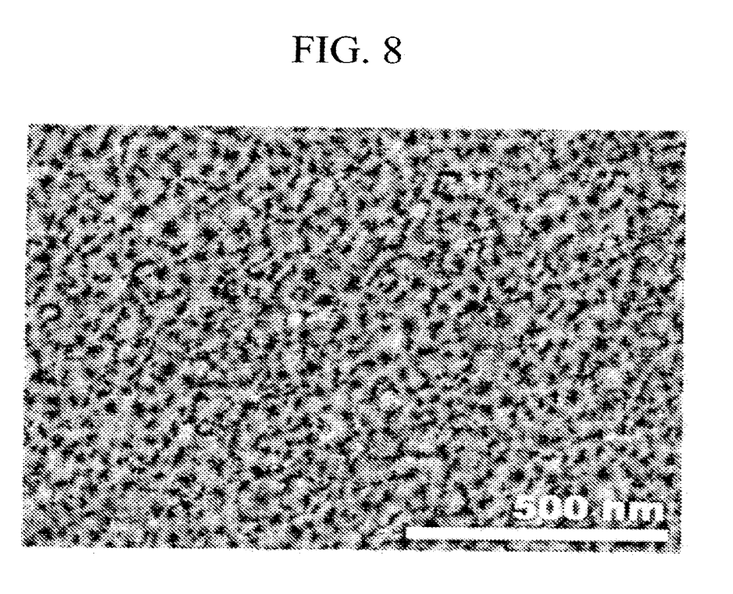
FIG. 8 is an SEM image of the surface of a zinc oxide-based transparent conductive layer manufactured according to comparative example 6.
Figure 9:
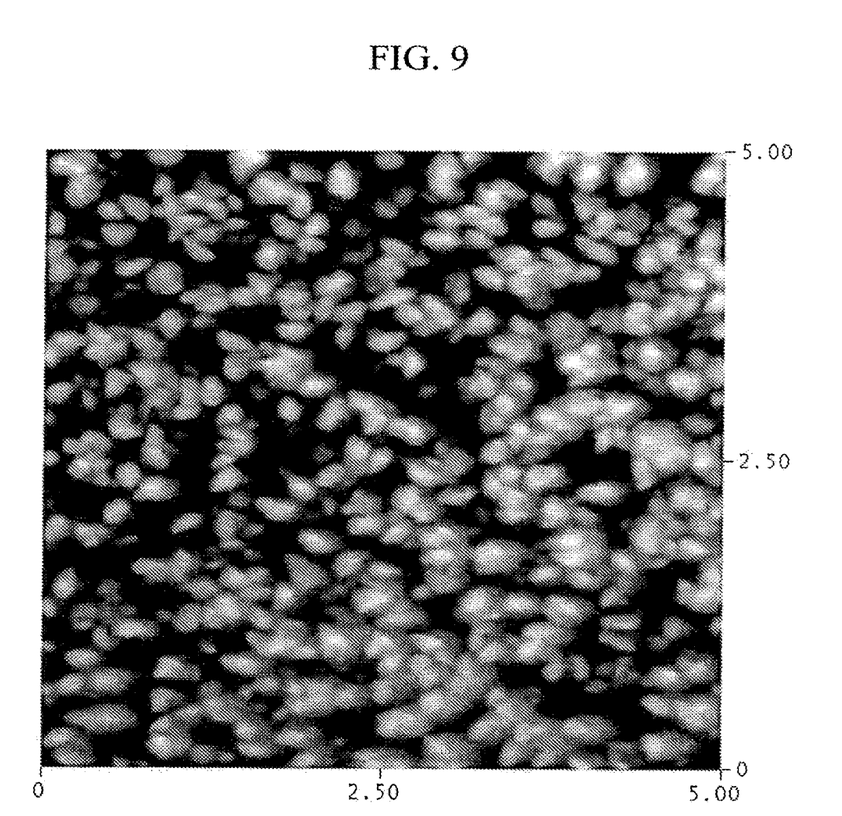
FIG. 9 is an AFM (Atomic Force Microscopy) image of the zinc oxide-based transparent conductive layer manufactured according to example 2.

The shape of surface texture and roughness of each zinc oxide-based transparent conductive layer manufactured according to example 2 and comparative example 4 was analyzed through SEM and AFM, and the results are shown in Table 5 and FIGS. 7 to 9. The conductive layer was measured at the center (referred to as "c" in Table 5) and edge (referred to as "e" in Table 5).

TABLE 5

| Classification | Sputtering conditions | Surface texturing | Roughness ($R_a$ (nm)) |
|---|---|---|---|
| Example 2 | Ga(2.5 wt %) doping + B (0.2 wt %) doping + Ar + H₂ + H₂O | ○ | c~e = 21 |
| Comparative example 4 | Ga(2.5 wt %) doping + Ar + H₂O | X | c~e = 3 |

As shown in Table 5, the example 2 of the present invention exhibited sufficient surface texture and consequently effective roughness, while the comparative example 4 did not so.

And, referring to FIGS. 7 and 8, the example 2 of the present invention has a textured surface (FIG. 7), while the comparative example 4 shows the surface is hardly textured (FIG. 8). Referring to FIG. 9, the example 2 of the present invention shows the entire surface is uniformly textured.

What is claimed is:

1. A method for manufacturing a zinc oxide-based transparent conductive layer having a textured surface, comprising:
    sputtering directly on a glass or plastic substrate a zinc oxide-based conductive layer using a zinc oxide target having a dopant content of more than 0 wt % to less than or equal to 4 wt % in the presence of a mixed gas of argon and hydrogen under conditions of pressure of 1 to 30 mTorr and temperature of 100 to 500° C.,
    wherein the textured surface has a total number of protrusions, including a first type and a second type, the first type protrusion formed with a ridge with an arc in its protruding direction, the second type protrusion formed with an apex having two ridges with an obtuse angle of 90° or more,
    wherein the number of the first and second type protrusions is 40% or more of the total number of protrusions, and
    wherein the zinc oxide-based conductive layer has gallium and boron as a dopant, and the total number of protrusions have surface roughness, Ra of 15 nm or more.

2. The method of manufacturing a zinc oxide-based transparent conductive layer according to claim 1,
    wherein H₂O is further introduced during the sputtering process.

3. The method for manufacturing a zinc oxide-based transparent conductive layer according to claim 1,
    wherein the content of the hydrogen gas is 1 to 30 vol % relative to the entire gas.

* * * * *